(12) United States Patent
Sutton et al.

(10) Patent No.: US 6,722,642 B1
(45) Date of Patent: Apr. 20, 2004

(54) HIGH PRESSURE COMPATIBLE VACUUM CHUCK FOR SEMICONDUCTOR WAFER INCLUDING LIFT MECHANISM

(75) Inventors: Thomas R. Sutton, Mesa, AZ (US); Maximilan A. Biberger, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 7 days.

(21) Appl. No.: 10/289,830

(22) Filed: Nov. 6, 2002

(51) Int. Cl.⁷ .................................................. B25B 11/00
(52) U.S. Cl. .......................................... 269/21; 269/47
(58) Field of Search ........................... 269/21, 20, 54.1, 269/47, 900; 279/3; 294/64.1

(56) References Cited

U.S. PATENT DOCUMENTS

| | | |
|---|---|---|
| 4,749,440 A | 6/1988 | Blackwood et al. |
| 4,944,837 A | 7/1990 | Nishikawa et al. |
| 4,951,601 A | 8/1990 | Maydan et al. |
| 5,143,103 A | 9/1992 | Basso et al. |
| 5,193,560 A | 3/1993 | Tanaka et al. |
| 5,195,878 A | 3/1993 | Sahiavo et al. |
| 5,213,485 A | 5/1993 | Wilden |
| 5,221,019 A | 6/1993 | Pechacek et al. |
| 5,222,876 A | 6/1993 | Budde |
| 5,224,504 A | 7/1993 | Thompson et al. |
| 5,236,669 A | 8/1993 | Simmons et al. |
| 5,237,824 A | 8/1993 | Pawliszyn |
| 5,240,390 A | 8/1993 | Kvinge et al. |
| 5,243,821 A | 9/1993 | Schuck et al. |
| 5,246,500 A | 9/1993 | Samata et al. |
| 5,251,776 A | 10/1993 | Morgan, Jr. et al. |
| 5,261,965 A | 11/1993 | Moslehi |
| 5,267,455 A | 12/1993 | Dewees et al. |
| 5,280,693 A | 1/1994 | Heudecker |
| 5,285,352 A | 2/1994 | Pastore et al. |
| 5,288,333 A | 2/1994 | Tanaka et al. |
| 5,313,965 A | 5/1994 | Palen |
| 5,314,574 A | 5/1994 | Takahashi |
| 5,328,722 A | 7/1994 | Ghanayem et al. |
| 5,337,446 A | 8/1994 | Smith et al. |
| 5,339,844 A | 8/1994 | Stanford, Jr. et al. |
| 5,352,327 A | 10/1994 | Witowski |
| 5,355,901 A | 10/1994 | Mielnik et al. |
| 5,368,171 A | 11/1994 | Jackson |
| 5,370,741 A | 12/1994 | Bergman |
| 5,377,705 A | 1/1995 | Smith, Jr. et al. |
| 5,401,322 A | 3/1995 | Marshall |
| 5,404,894 A | 4/1995 | Shiraiwa |
| 5,412,958 A | 5/1995 | Iliff et al. |
| 5,417,768 A | 5/1995 | Smith, Jr. et al. |
| 5,433,334 A | 7/1995 | Reneau |
| 5,447,294 A | 9/1995 | Sakata et al. |
| 5,503,176 A | 4/1996 | Dunmire et al. |

(List continued on next page.)

FOREIGN PATENT DOCUMENTS

WO     WO 87/07309     12/1987

*Primary Examiner*—Lee D. Wilson
(74) *Attorney, Agent, or Firm*—Haverstock & Owens LLP (57) ABSTRACT

A vacuum chuck for holding a semiconductor wafer during high pressure processing comprises a wafer platen, first through third lift pins, and an actuator mechanism. The wafer platen comprises a smooth surface, first through third lift pin holes, and a vacuum opening. In use, the vacuum opening applies vacuum to a surface of a semiconductor wafer, which chucks the semiconductor wafer to the wafer platen. The first through third lift pins mount within the first through third lift pin holes, respectively. The actuator mechanism couples the first through third lifting pins to the wafer platen. The actuator mechanism operates to extend the first through third lift pins in unison above the smooth surface of the wafer platen. The actuator mechanism operates to retract the first through third lift pins in unison to at least flush with the smooth surface of the wafer platen.

29 Claims, 9 Drawing Sheets

U.S. PATENT DOCUMENTS

| | | | |
|---|---|---|---|
| 5,505,219 A | 4/1996 | Lansberry et al. | |
| 5,509,431 A | 4/1996 | Smith, Jr. et al. | |
| 5,526,834 A | 6/1996 | Mielnik et al. | |
| 5,533,538 A | 7/1996 | Marshall | |
| 5,571,330 A | 11/1996 | Kyogoku | |
| 5,589,224 A | 12/1996 | Tepman et al. | |
| 5,621,982 A | 4/1997 | Yamashita et al. | |
| 5,629,918 A | 5/1997 | Ho et al. | |
| 5,644,855 A | 7/1997 | McDermott et al. | |
| 5,649,809 A | 7/1997 | Stapelfeldt | |
| 5,656,097 A | 8/1997 | Olesen et al. | |
| 5,669,251 A | 9/1997 | Townsend et al. | |
| 5,702,228 A | 12/1997 | Tamai et al. | |
| 5,706,319 A | 1/1998 | Holtz | |
| 5,746,008 A | 5/1998 | Yamashita et al. | |
| 5,797,719 A | 8/1998 | James et al. | |
| 5,798,126 A | 8/1998 | Fijikawa et al. | |
| 5,881,577 A | 3/1999 | Sauer et al. | |
| 5,882,165 A | 3/1999 | Maydan et al. | |
| 5,888,050 A | 3/1999 | Fitzgerald et al. | |
| 5,898,727 A | 4/1999 | Fujikawa et al. | |
| 5,900,107 A | 5/1999 | Murphy et al. | |
| 5,904,737 A | 5/1999 | Preston et al. | |
| 5,928,389 A | 7/1999 | Jevtic | |
| 5,932,100 A | 8/1999 | Yager et al. | |
| 5,934,856 A | 8/1999 | Asakawa et al. | |
| 5,934,991 A | 8/1999 | Rush | |
| 5,979,306 A | 11/1999 | Fujikawa et al. | |
| 5,980,648 A | 11/1999 | Adler | |
| 5,981,399 A | 11/1999 | Kawamura et al. | |
| 5,989,342 A | 11/1999 | Ikeda et al. | |
| 6,005,226 A | 12/1999 | Aschner et al. | |
| 6,017,820 A | 1/2000 | Ting et al. | |
| 6,029,371 A | 2/2000 | Kamikawa et al. | |
| 6,035,871 A | 3/2000 | Eui-Yeol | |
| 6,037,277 A | 3/2000 | Masakara et al. | |
| 6,053,348 A | 4/2000 | Morch | |
| 6,056,008 A | 5/2000 | Adams et al. | |
| 6,067,728 A | 5/2000 | Farmer et al. | |
| 6,077,053 A | 6/2000 | Fujikawa et al. | |
| 6,077,321 A | 6/2000 | Adachi et al. | |
| 6,082,150 A | 7/2000 | Stucker | |
| 6,085,935 A | 7/2000 | Malchow et al. | |
| 6,097,015 A | 8/2000 | McCullough et al. | |
| 6,128,830 A | 10/2000 | Bettcher et al. | |
| 6,145,519 A | 11/2000 | Konishi et al. | |
| 6,159,295 A | 12/2000 | Maskara et al. | |
| 6,164,297 A | 12/2000 | Kamikawa | |
| 6,186,722 B1 | 2/2001 | Shirai | |
| 6,203,582 B1 | 3/2001 | Berner et al. | |
| 6,216,364 B1 | 4/2001 | Tanaka et al. | |
| 6,228,563 B1 | 5/2001 | Starov et al. | |
| 6,235,634 B1 | 5/2001 | White et al. | |
| 6,239,038 B1 | 5/2001 | Wen | |
| 6,241,825 B1 * | 6/2001 | Wytman | 118/733 |
| 6,244,121 B1 | 6/2001 | Hunter | |
| 6,251,250 B1 | 6/2001 | Keigler | |
| 6,277,753 B1 | 8/2001 | Mullee et al. | |
| 6,286,231 B1 | 9/2001 | Bergman et al. | |
| 6,305,677 B1 * | 10/2001 | Lenz | 269/13 |
| 6,334,266 B1 | 1/2002 | Moritz et al. | |
| 6,344,174 B1 | 2/2002 | Miller et al. | |
| 6,521,466 B1 | 2/2002 | Castrucci | |
| 6,388,317 B1 | 5/2002 | Reese | |
| 6,389,677 B1 * | 5/2002 | Lenz | 29/559 |
| 6,418,956 B1 | 7/2002 | Bloom | |
| 6,436,824 B1 | 8/2002 | Chooi et al. | |
| 6,454,945 B1 | 9/2002 | Weigl et al. | |
| 6,464,790 B1 * | 10/2002 | Sherstinsky et al. | 118/715 |
| 6,541,278 B2 | 4/2003 | Morita et al. | |
| 6,546,946 B2 | 4/2003 | Dunmire | |
| 6,550,484 B1 | 4/2003 | Gopinath et al. | |
| 6,558,475 B1 | 5/2003 | Jur et al. | |
| 6,561,213 B2 | 5/2003 | Wang et al. | |
| 6,561,220 B2 | 5/2003 | McCullough et al. | |
| 6,561,481 B1 | 5/2003 | Filonczuk | |
| 6,561,797 B1 | 5/2003 | Biberger et al. | |
| 6,564,826 B2 | 5/2003 | Shen | |
| 2002/0001929 A1 | 1/2002 | Biberger et al. | |

* cited by examiner

HIGH PRESSURE COMPATIBLE VACUUM CHUCK FOR SEMICONDUCTOR WAFER INCLUDING LIFT MECHANISM

FIELD OF THE INVENTION

This invention relates to the field of high pressure processing. More particularly, this invention relates to the field of high pressure processing of a semiconductor wafer.

BACKGROUND OF THE INVENTION

Processing of semiconductor wafers presents unique problems not associated with processing of other workpieces. Typically, the semiconductor processing begins with a silicon wafer. The semiconductor processing starts with doping of the silicon wafer to produce transistors. Next, the semiconductor processing continues with deposition of metal and dielectric layers interspersed with etching of lines and vias to produce transistor contacts and interconnect structures. Ultimately in the semiconductor processing, the transistors, the transistor contacts, and the interconnects form integrated circuits.

A critical processing requirement for the processing of the semiconductor wafer is cleanliness. Much of semiconductor processing takes place in vacuum, which is an inherently clean environment. Other semiconductor processing takes place in a wet process at atmospheric pressure, which because of a rinsing nature of the wet process is an inherently clean process. For example, removal of photoresist and photoresist residue subsequent to etching of the lines and the vias uses plasma ashing, a vacuum process, followed by stripping in a stripper bath, a wet process.

Other critical processing requirements for the processing of the semiconductor wafers include throughput and reliability. Production processing of the semiconductor wafers takes place in a semiconductor fabrication facility. The semiconductor fabrication facility requires a large capital outlay for processing equipment, for the facility itself, and for a staff to run it. In order to recoup these expenses and generate a sufficient income from the facility, the processing equipment requires a throughput of a sufficient number of the wafers in a period of time. The processing equipment must also promote a reliable process in order to ensure continued revenue from the facility.

Until recently, the plasma ashing and the stripper bath were found sufficient for the removal of the photoresist and the photoresist residue in the semiconductor processing. However, recent advancements for the integrated circuits have made the plasma ashing and the stripper bath untenable for highly advanced integrated circuits. These recent advancements include small critical dimensions for etch features and low dielectric constant materials for insulators. The small critical dimensions for the etch features result in insufficient structure for lines to withstand the stripper bath leading to a need for a replacement for the stripper bath. Many of the low dielectric constant materials cannot withstand an oxygen environment of the plasma ashing leading to a need for a replacement for the plasma ashing.

Recently, interest has developed in replacing the plasma ashing and the stripper bath for the removal of the photoresist and the photoresist residue with a supercritical process. However, high pressure processing chambers of existing supercritical processing systems are not appropriate to meet the unique needs of the semiconductor processing. In particular, high pressure chambers of existing supercritical processing systems do not provide a mechanism for handling the semiconductor wafer during loading and unloading nor for holding the semiconductor during e supercritical processing. It is critical that the mechanism provides handling and holding of the semiconductor wafers without breaking or otherwise damaging the semiconductor wafers.

What is needed is a mechanism for handling semiconductor wafers during loading and unloading of the semiconductor wafers into and out of a supercritical processing chamber and for holding the semiconductor wafers during the supercritical processing which promotes cleanliness, which is economical, which is efficient, and which does not break the semiconductor wafers.

SUMMARY OF THE INVENTION

The present invention is a vacuum chuck for holding a semiconductor wafer during high pressure processing. The vacuum chuck comprises a wafer platen, first through third lift pins, and an actuator mechanism. The wafer platen comprises a smooth surface, first through third lift pin holes, and a vacuum opening. In use, the vacuum opening applies vacuum to a surface of a semiconductor wafer, which chucks the semiconductor wafer to the wafer platen. The first through third lift pins mount within the first through third lift pin holes, respectively. The actuator mechanism couples the first through third lifting pins to the wafer platen. The actuator mechanism operates to extend the first through third lift pins in unison above the smooth surface of the wafer platen. The actuator mechanism operates to retract the first through third lift pins in unison to at least flush with the smooth surface of the wafer platen.

DETAILED DESCRIPTION OF INVENTION

Figure 1:
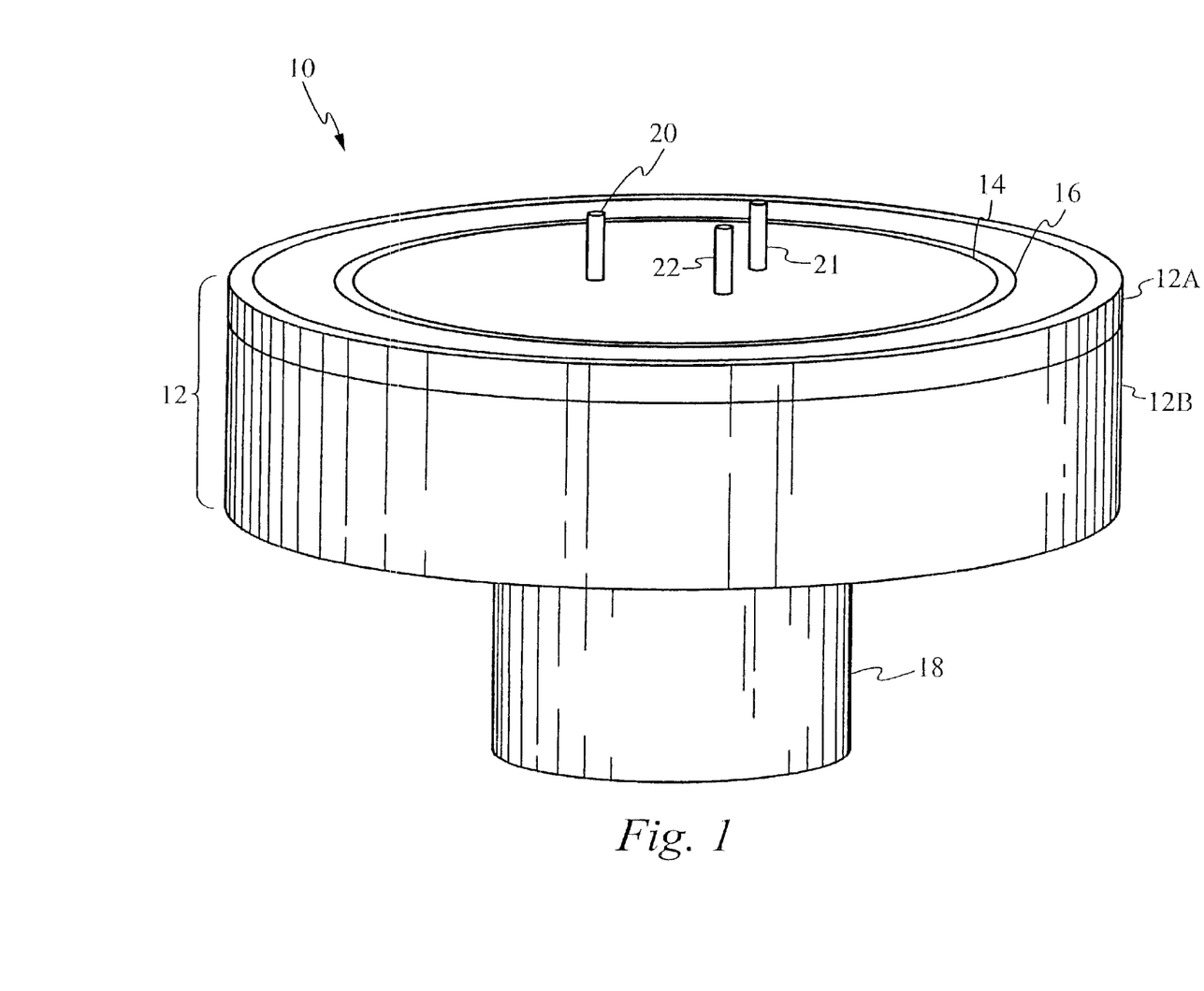
FIG. 1 illustrates the preferred vacuum chuck of the present invention.

The preferred vacuum chuck of the present invention is illustrated in FIG. 1. The preferred vacuum chuck 10 comprises a wafer platen assembly 12 and a lift mechanism. Preferably, the wafer platen assembly 12 comprises an upper platen 12A and a lower platen 12B. Alternatively, the wafer platen assembly comprises a single piece platen. The upper platen 12A preferably comprises first and second vacuum grooves, 14 and 16. Alternatively, the upper platen 12A comprises the first vacuum groove 14. The lift mechanism comprises a cylinder support 18, an air cylinder (not shown), a pin support (not shown), and first through third lift pins, 20 . . . 22.

Figure 2:
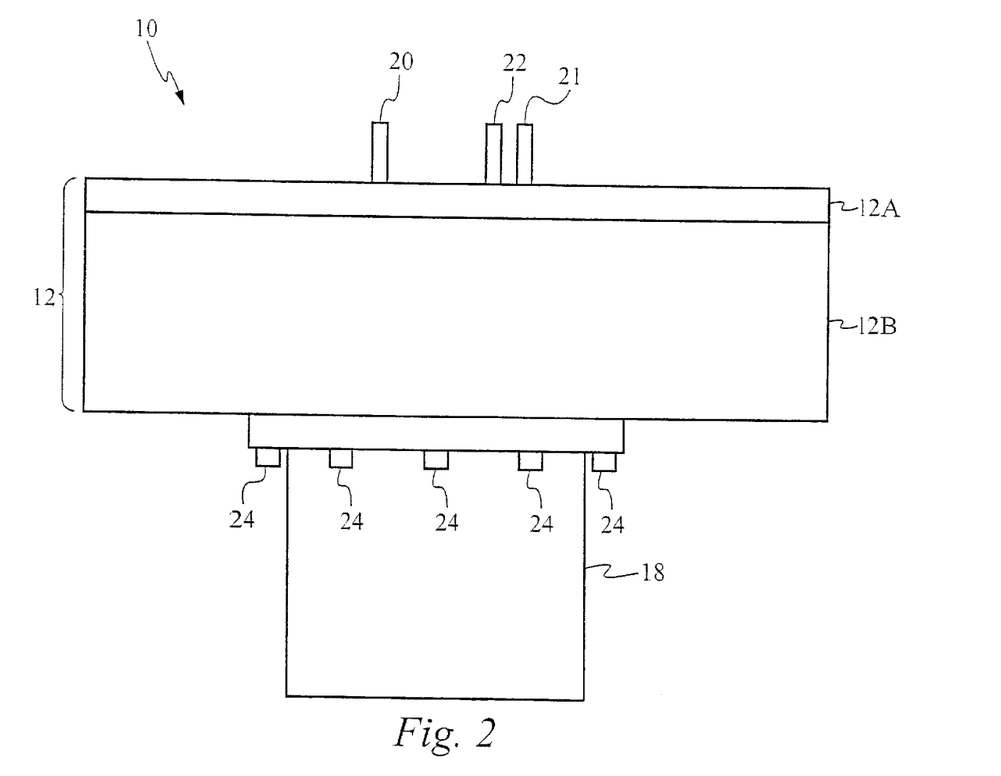
FIG. 2 further illustrates the preferred vacuum chuck of the present invention.

A side view of the preferred vacuum chuck 10 is illustrated in FIG. 2. Preferably, a plurality of threaded fasteners 24 couple the cylinder support 18 to the lower platen 12B.

Figure 3:
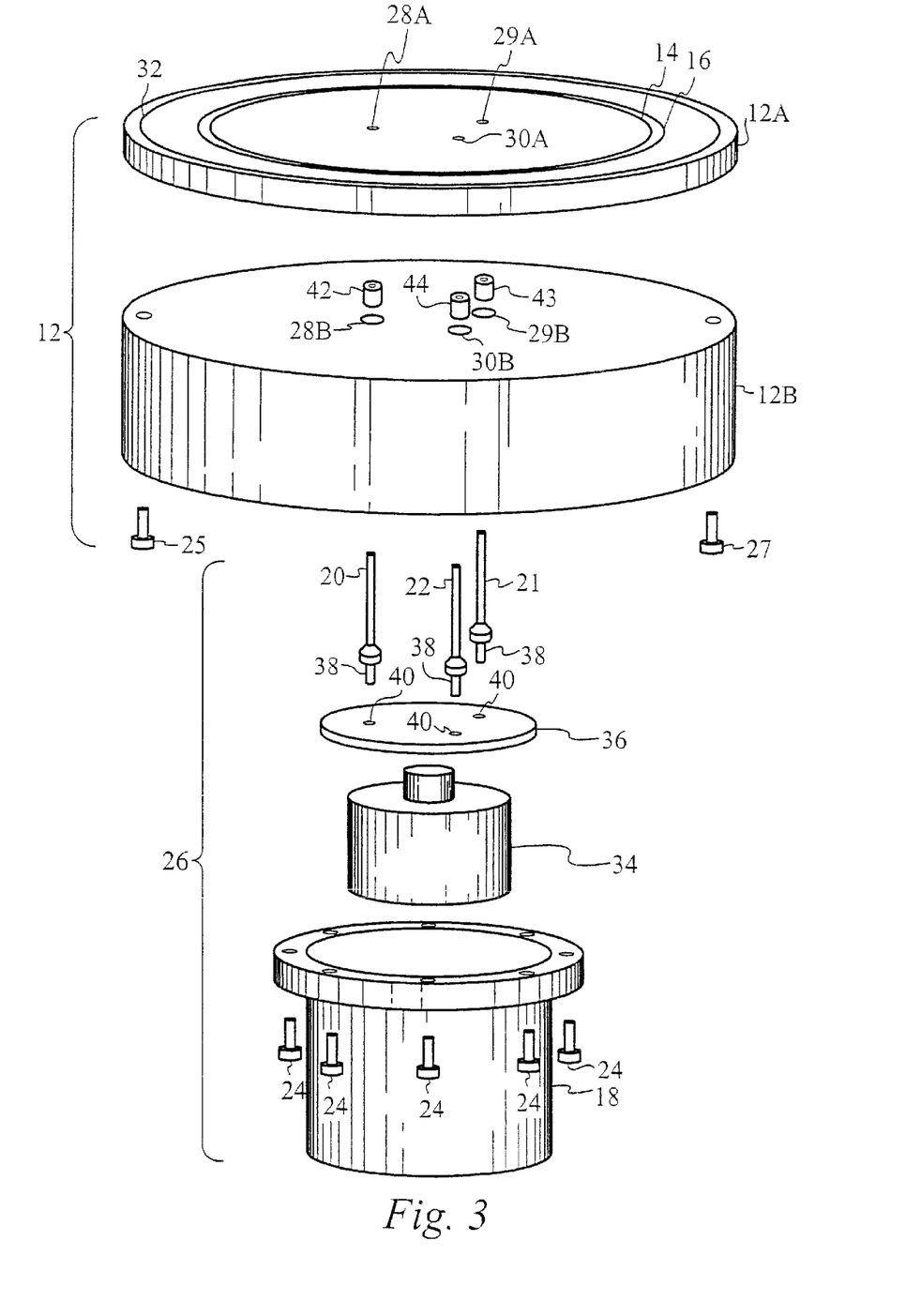
FIG. 3 illustrates an exploded view of the preferred vacuum chuck of the present invention.

An exploded view of the preferred vacuum chuck 10 is illustrated in FIG. 3. The preferred vacuum chuck comprises the wafer platen assembly 12 and the lift mechanism 26. The wafer platen assembly 12 preferably comprises the upper platen 12A, the lower platen 12B, first and second threaded fasteners, 25 and 27, and first through third nylon inserts, 42 . . . 44. The upper platen 12A comprises the first and second vacuum grooves, 14 and 16, first through third upper lift pin holes, 28A . . . 30A, and an o-ring groove 32. The lower platen comprises first through third lower lift pin holes, 28B . . . 30B.

When assembled, the first and second threaded fasteners, 25 and 27, couple the upper platen 12A to the lower platen 12B. Further, when assembled, the first upper and lower lift pin holes, 28A and 28B, form a first lift pin hole, the second upper and lower lift pin holes, 29A and 29B, form a second lift pin hole, and the third upper and lower lift pin holes, 30A and 30B form a third lift pin hole. Preferably, the first through nylon inserts, 42 . . . 44, couple to top ends of the first through third lower lift pin holes, 28B . . . 30B, respectively. Alternatively, the first through third nylon inserts, 42 . . . 44, couple elsewhere along the first through third lift pin holes. Further alternatively, the first through third nylon inserts, 42 . . . 44, are not included in the wafer platen assembly 12.

The lift mechanism comprises the cylinder support 18, the air cylinder 34, the pin support 36, and the first through third lift pins, 20 . . . 22. The first through third lift pins, 20 . . . 22, couple to the pin support 36. Preferably, the first through third lift pins, 20 . . . 22, include threaded ends 38 which thread into threaded holes 40 in the pin support 36. The pin support 36 couples to the air cylinder 34. The air cylinder 34 couples to the cylinder support 18. The cylinder support 18 couples to the wafer platen assembly 12.

It will be readily apparent to one skilled in the art that the air cylinder may be replaced by another drive mechanism such as an alternative fluid drive mechanism or an electro-mechanical drive mechanism.

Figure 4:
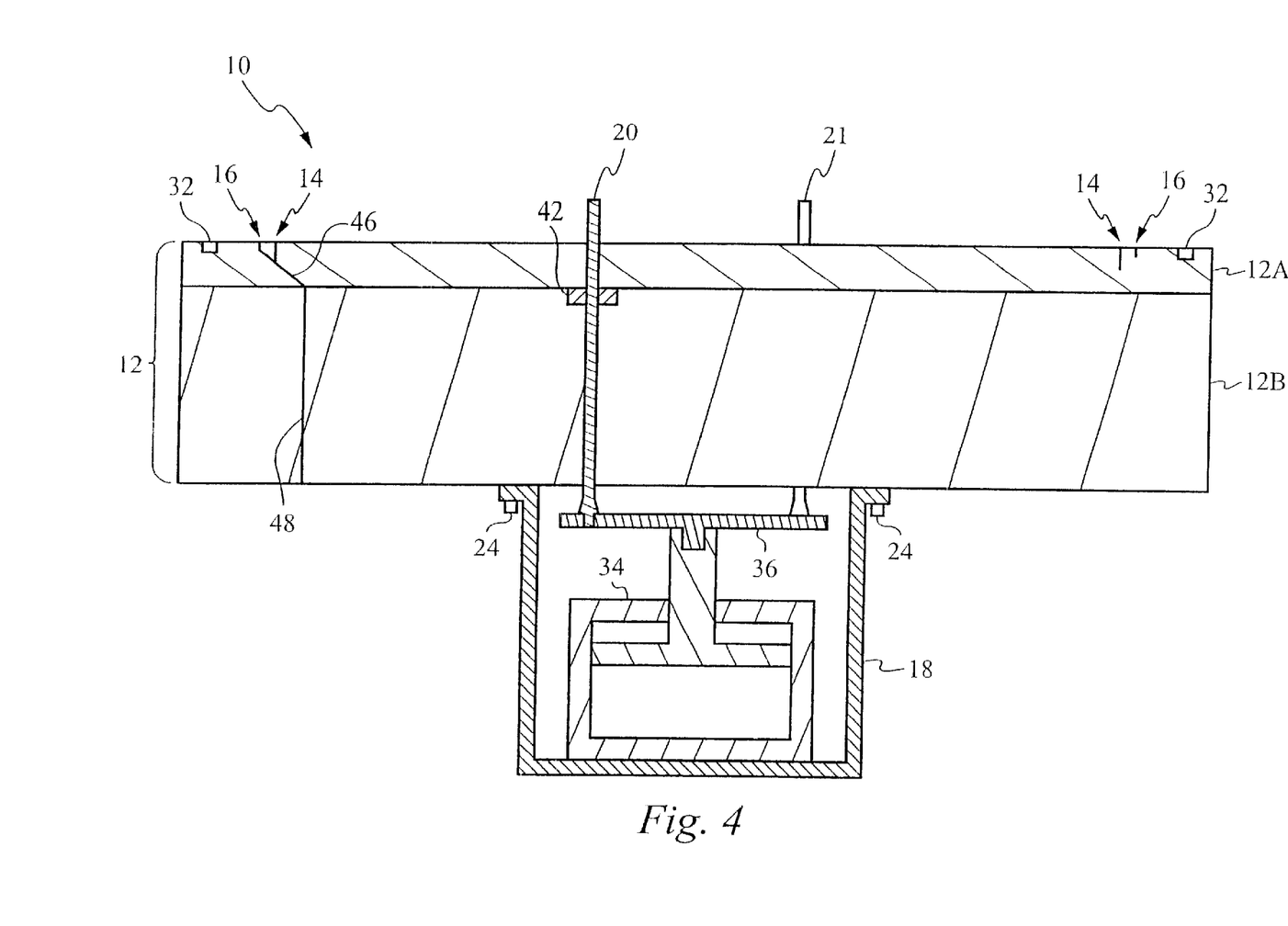
FIG. 4 illustrates a cross-section of the preferred vacuum chuck of the present invention.

A cross-section of the preferred vacuum chuck 10 of the present invention is illustrated in FIG. 4. The preferred vacuum chuck 10 includes a first vacuum passage 46 in the upper platen 12A coupling the first and second vacuum grooves, 14 and 16, to a second vacuum passage 48 in the lower platen 12B. In use, the second vacuum passage 48 couples to a vacuum pump (not shown) which provides vacuum to the first and second vacuum grooves, 14 and 16, which chuck a semiconductor wafer (not shown) to the upper platen 12A.

Figure 5:
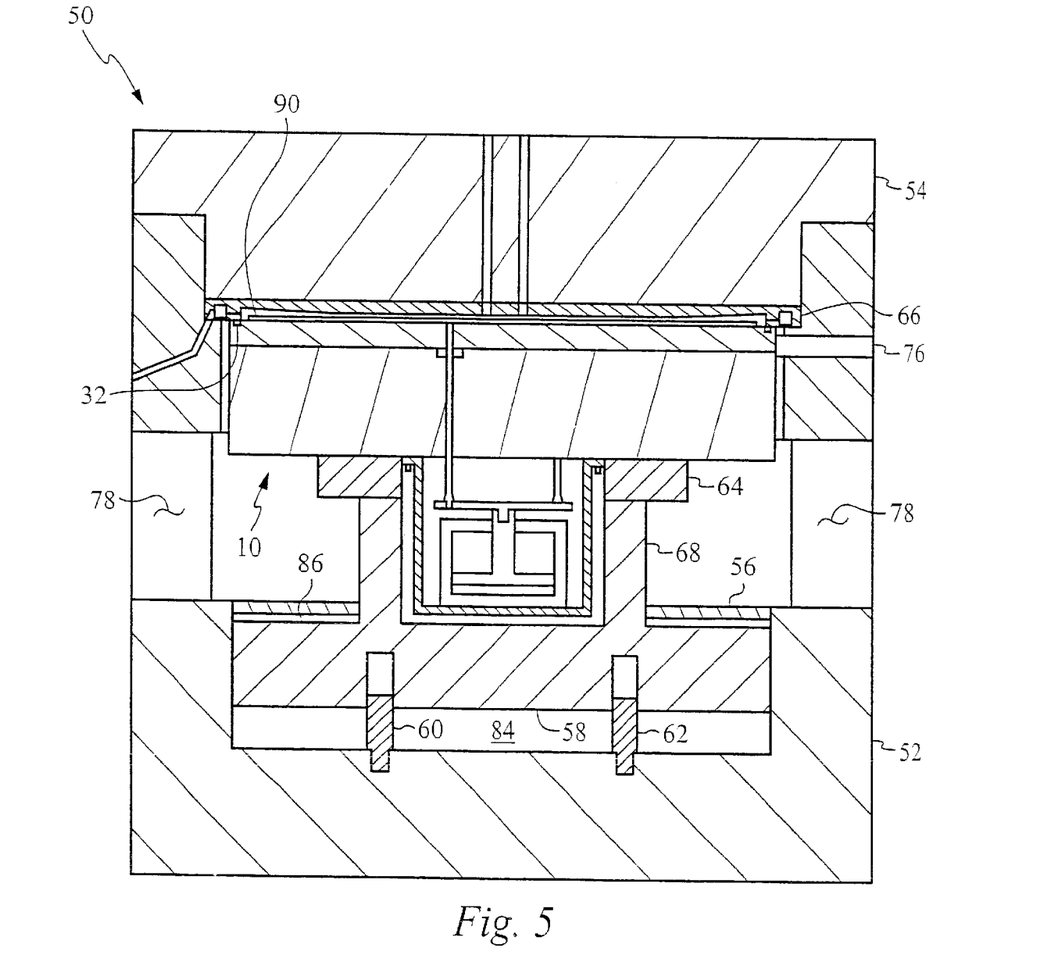
FIG. 5 illustrates a pressure vessel incorporating the preferred vacuum chuck of the present invention.

A cross-section of a pressure chamber incorporating the preferred vacuum chuck 10 of the present invention is illustrated in FIG. 5. The pressure chamber 50 comprises a pressure chamber frame 52, a chamber lid 54, the preferred vacuum chuck 10, a sealing plate 56, a piston 58, first and second guide pins, 60 and 62, an interface ring 64, and an upper cavity plate/injection ring 66.

Figure 6:
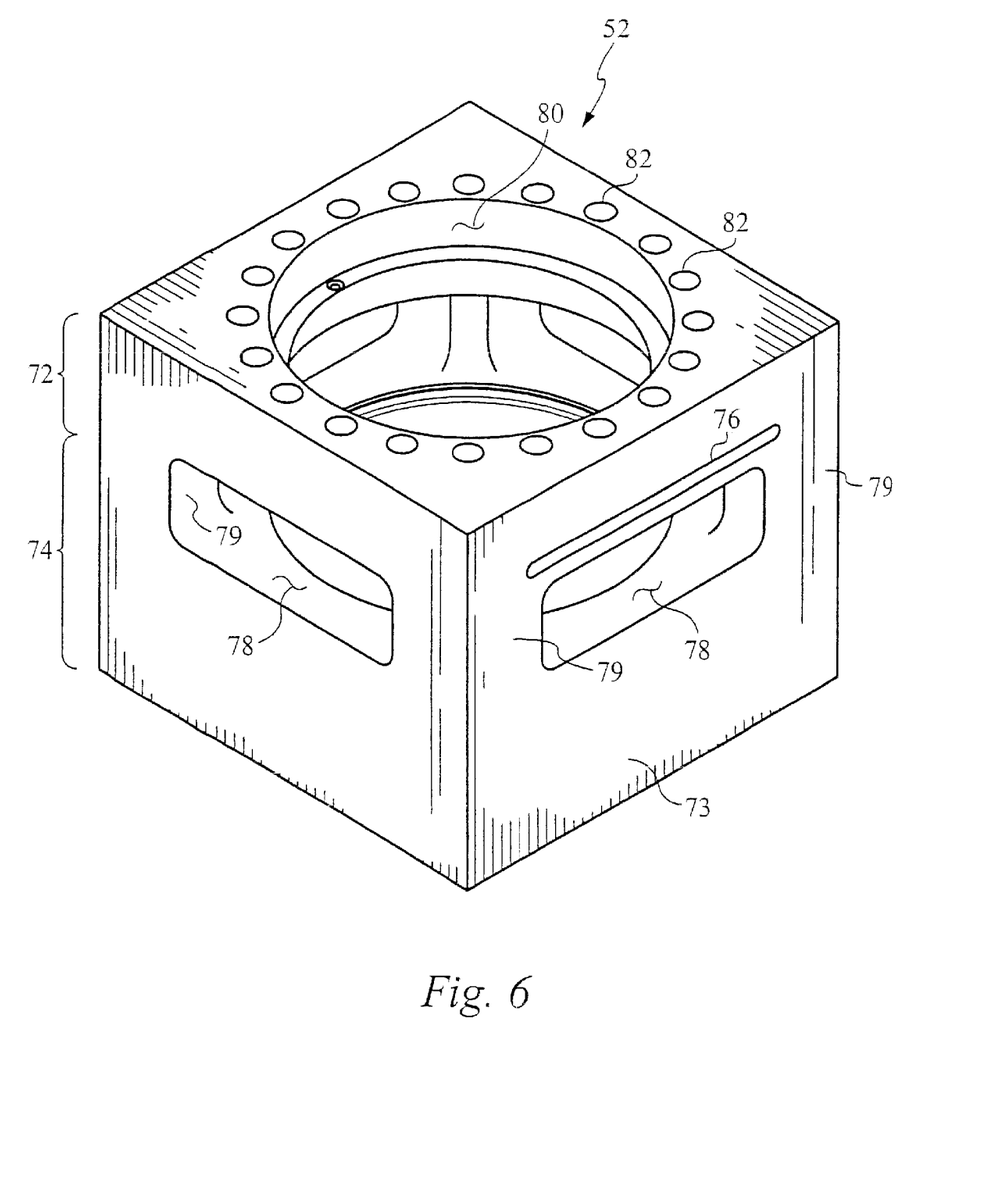
FIG. 6 illustrates a pressure chamber frame of the present invention.

The pressure chamber frame 52 of the present invention is illustrated isometrically in FIG. 6. The pressure chamber frame 52 comprises a pressure chamber housing portion 72, a hydraulic actuation portion 74, a wafer slit 76, windows 78, posts 79, a top opening 80, and bolt holes 82. The wafer slit 76 is preferably sized for a 300 mm wafer. Alternatively, the wafer slit 76 is sized for a larger or a smaller wafer. Further alternatively, the wafer slit 76 is sized for a semiconductor substrate other than a wafer, such as a puck.

The hydraulic actuation portion 74 of the pressure chamber frame 52 includes the windows 78, which provide access for assembly and disassembly of the pressure chamber 50 (FIG. 5). Preferably, there are four of the windows 78, which are located on sides of the pressure chamber frame 52. Preferably, each of the windows 78 are framed on their sides by two of the posts 79, on their top by the pressure chamber housing portion 72, and on their bottom by a base 73. The bolt holes 82 receive bolts (not shown), which fasten the chamber lid 54 (FIG. 5) to the pressure chamber frame 52.

Referring to FIG. 5, the first and second guide pins, 60 and 62, couple to the pressure chamber frame 52. The piston 58 couples to the pressure chamber frame 52 and to the first and second guide pins, 60 and 62. The piston 58 and the pressure chamber frame 52 form a hydraulic cavity 84. The sealing plate 56 couples to the pressure chamber frame 52 and to a neck portion 68 of the piston 58, which forms a pneumatic cavity 86. The neck portion 68 of the piston 58 couples to the interface ring 64. The preferred vacuum chuck 10 couples to the interface ring 64. The upper cavity plate/injection ring 66 couples to the pressure chamber frame 52. The chamber lid 54 couples to the pressure chamber frame 52 and upper cavity plate/injection ring 66.

It will be readily apparent to one skilled in the art that fasteners couple the preferred vacuum chuck 10 to the interface ring 64, couple the interface ring 64 to the neck portion 68 of the piston 58, and couple the sealing plate 56 to the pressure chamber frame 52.

FIG. 5 illustrates the pressure chamber 50 in a closed configuration. In the closed configuration, an o-ring in the o-ring groove 32 seals the upper platen 12A to the upper cavity plate/injection ring 66, which forms a wafer cavity 88 for a semiconductor wafer 90.

Referring to FIGS. 4 and 5, operation of the preferred vacuum chuck 10 and the pressure chamber 50 of the present invention begins with the pressure chamber 50 in the closed configuration and with the wafer cavity 88 not holding the semiconductor wafer 90. In a first step, a hydraulic system (not shown) releases hydraulic pressure to the hydraulic cavity 84 and a pneumatic system pressurizes the pneumatic cavity 86. This causes the piston 58 and, consequently, the preferred vacuum chuck 10 to move away from the upper cavity plate/injection ring 66 and it causes an upper surface of the upper platen 12A to come to rest at or below the wafer slit 76.

In a second step, a robot paddle (not shown) inserts the semiconductor wafer 90 through the wafer slit 76. In a third step, the air cylinder 34, which is driven by the pneumatic system, raises the pin support 36 and, consequently, the first through third lift pins, 20 . . . 22. This raises the semiconductor wafer 90 off the robot paddle. In a sixth step, the robot paddle retracts. In a seventh step, the air cylinder 34 lowers the pin support 36, the first through third lift pins, 20 . . . 22, and the semiconductor wafer 90 until the semiconductor wafer 90 rests upon the upper platen 12A. In an eighth step, a vacuum applied via the first and second vacuum passages, 46 and 48, clamps the semiconductor wafer 90 to the preferred vacuum chuck 10.

In a ninth step, the pneumatic system releases the pneumatic pressure to the pneumatic cavity 86 and the hydraulic system pressurizes the hydraulic cavity 84. This causes the piston 58 and, consequently, the preferred vacuum chuck 10 to rise. It also causes the o-ring in the o-ring groove of the upper platen 12A to seal to the upper cavity plate/injection ring 66, which forms the wafer cavity 88 for high pressure processing of the semiconductor wafer 90.

After high pressure processing of the semiconductor wafer 90 in the wafer cavity 88, the semiconductor wafer 90 is removed in an unloading operation. The unloading operation is a reverse of the loading operation.

Figure 7A:
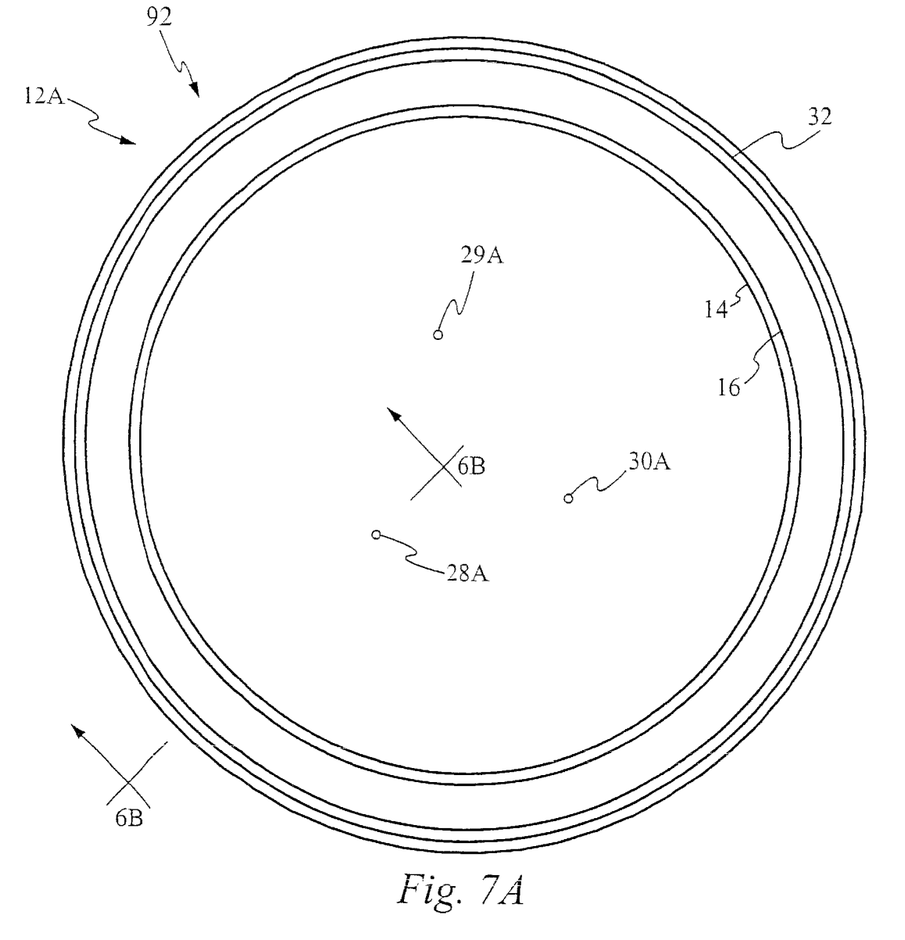
FIGS. 7A through 7C illustrate an upper platen of the preferred vacuum chuck of the present invention.
Figure 7B:
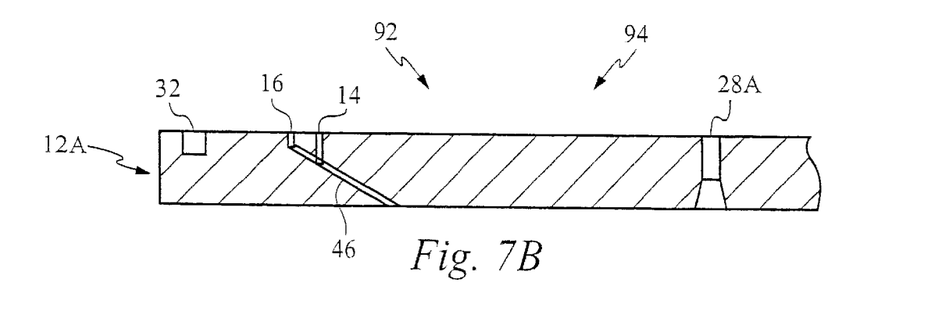
Figure 7C:
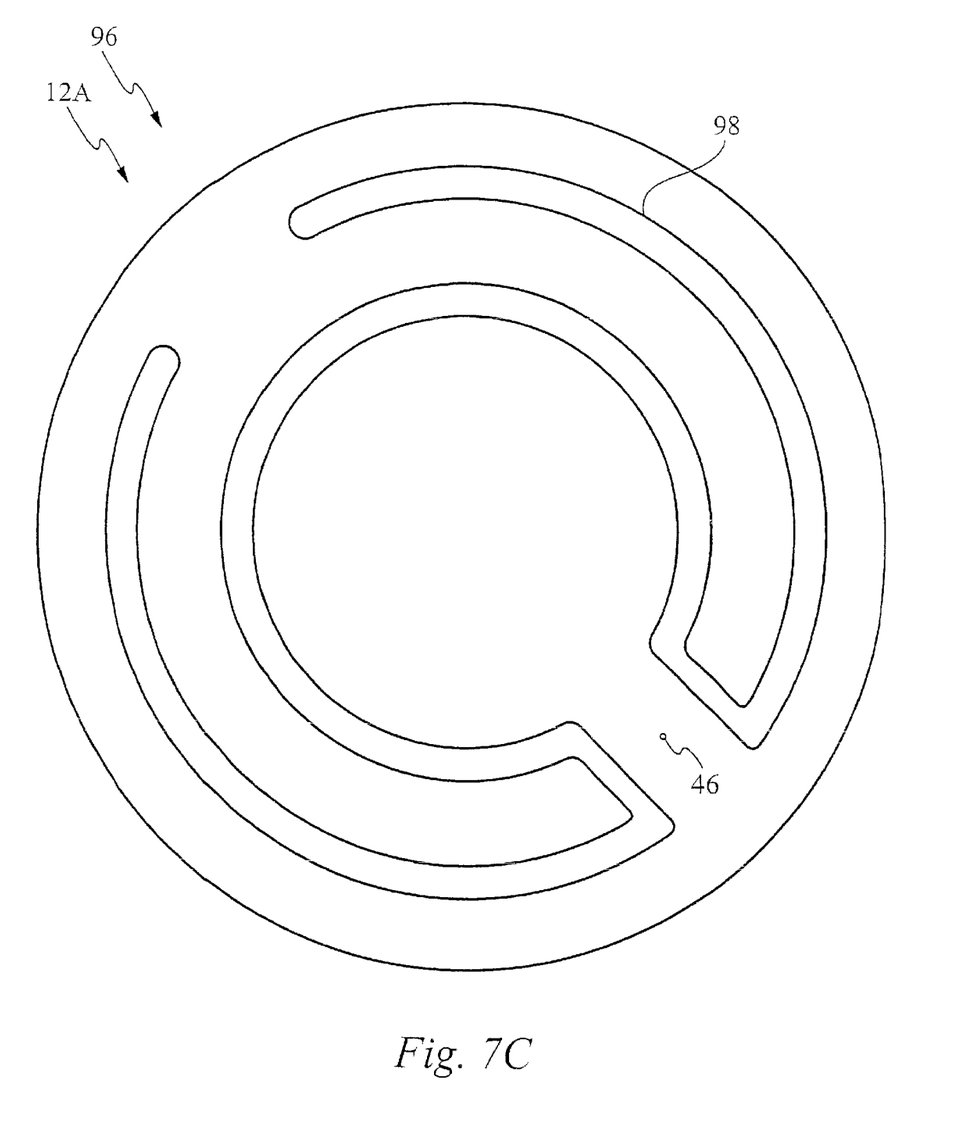

The upper platen 12A of the present invention is further illustrated in FIGS. 7A through 7C. FIG. 7A illustrates a wafer bearing surface 92, which in use supports the semiconductor wafer 90 (FIG. 5). The wafer bearing surface 92 includes the first and second vacuum grooves, 14 and 16, the first through third upper lift pin holes, 28A . . . 30A, and the first o-ring groove 32. Preferably, the upper platen 12A accommodates a 300 mm wafer. In order to protect most of a back side of the 300 mm wafer, the first and second vacuum grooves, 14 and 16, have a diameter slightly less than 300 mm. Alternatively, the upper platen 12A accommodates a different size wafer. Preferably, the wafer bearing surface 92, in the region that accommodates the 300 mm wafer, has a surface with no perturbations larger than about 0.0002 in. Alternatively, the wafer bearing surface 92, in the region that accommodates the 300 mm wafer has a surface with no perturbations larger that about 0.00015 in. Preferably, the wafer bearing surface 92 is fabricated by grinding and polishing to an 8 $\mu$in. finish. Alternatively, the wafer bearing surface 92 is fabricated by grinding and polishing to a 4 $\mu$in. finish.

FIG. 7B illustrates a partial cross-section 94 of the upper platen 12A. The partial cross-section 94 includes the first and second vacuum grooves, 14 and 16, the first upper lift pin hole 28A, the o-ring groove 32, and the first vacuum passage 46. Preferably, a width of the first and second vacuum grooves, 14 and 16, is not greater than about 0.060 in. Alternatively, the width of the first and second vacuum grooves, 14 and 16, is not greater than about 0.065 in. Preferably, a diameter of the first through third lift pin holes, 28 . . . 30, is not greater than about 0.060 in. Alternatively, the diameter of the first through third lift pin holes, 28 . . . 30, is not greater than about 0.065 in.

It has been found that 0.070 in. is a critical dimension for the preferred vacuum chuck. When the width of the first and second vacuum grooves, 14 and 16, and the diameter of the first through third lift pin holes, 28 . . . 30, are at or below about 0.100 in., the semiconductor wafer 90 (FIG. 5) does not break when exposed to thermodynamic conditions for supercritical carbon dioxide (pressure in excess of 1,073 psi and temperature in excess of 31° C.). If the width of the first or second vacuum groove, 14 or 16, or the diameter of the first, second, or third lift pin hole, 28, 29, or 30, exceeds about 0.100 in., the semiconductor wafer 90 breaks when exposed to the thermodynamic conditions of the supercritical carbon dioxide. By fabricating the width of the first and second vacuum grooves, 14 and 16, and the diameter of the first through third lift pin holes at about 0.060 in., a reasonable margin of safety is maintained in order to avoid breaking semiconductor wafers.

FIG. 7C illustrates a back side 96 of the upper platen 12A showing the first vacuum passage 46 and a heating element groove 98. Preferably, when assembled, the heating element groove 98 holds a heating element, which heats the semiconductor wafer 90 during processing.

Figure 8:
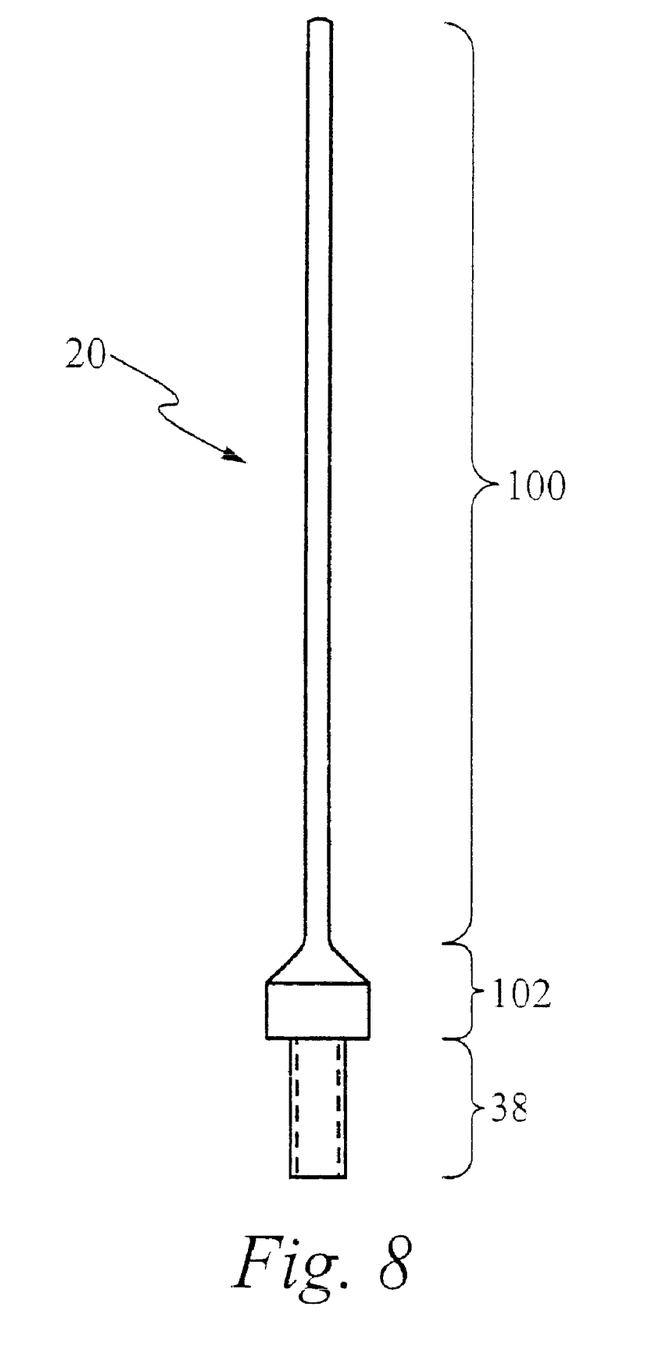
FIG. 8 illustrates a first lift pin of the present invention.

The first lift pin 20 is illustrated in FIG. 8. (It is noted that the first lift pin 20 is illustrative of the first through third lift pins 20 . . . 22.) The first lift pin 20 includes a shaft section 100, a shoulder section 102, and the threaded end 38. Preferably, the shaft section 100 has a diameter of 0.50 in., which fits in the first lift pin hole having the 0.060 in. diameter with a reasonable allowance. Preferably, the first lift pin 28 is fabricated of stainless steel. Preferably, the shaft section is machined by grinding. Alternatively, another method is used to fabricate the shaft section.

Operation of the pressure chamber 50 is taught in U.S. patent application Ser. No. 10/121,791, filed on Apr. 10, 2002, which is incorporated by reference in its entirety.

It will be readily apparent to one skilled in the art that other various modifications may be made to the preferred embodiment without departing from the spirit and scope of the invention as defined by the appended claims.

We claim:

1. A processing chamber for processing a semiconductor wafer during high pressure processing comprising:
    a. a wafer platen comprising a smooth surface, first through third lift pin holes, and a vacuum opening located within the smooth surface, the vacuum opening operable to apply a vacuum to a surface of the semiconductor wafer;
    b. first through third lift pins mounted within the first through third lift pin holes, respectively;
    c. an upper cavity plate configured to seal to the wafer platen, thereby forming a wafer cavity for entirely containing the semiconductor wafer during high-pressure processing;
    d. a first actuator mechanism coupling the first through third lift pins to the wafer platen, the first actuator mechanism operable to extend the first through third lift pins above the smooth surface of the wafer platen, the first actuator mechanism operable to retract the first through third lift pins to at least flush with the smooth surface of the wafer platen; and
    e. a second actuator mechanism coupled to the wafer platen, the second actuator mechanism operable to move the wafer platen against the upper cavity plate to seal the wafer platen to the upper cavity plate, thereby forming the wafer cavity.

2. The processing chamber of claim 1 wherein the smooth surface of the wafer platen comprises a semiconductor wafer holding region.

3. The processing chamber of claim 2 wherein the vacuum opening comprises a first proximately circular vacuum groove located within the semiconductor wafer holding region.

4. The processing chamber of claim 3 wherein the wafer platen further comprises a vacuum passage coupling the first proximately circular vacuum groove to a vacuum port located on a surface of the wafer platen outside of the semiconductor wafer holding region.

5. The processing chamber of claim 4 wherein the wafer platen further comprises a second proximately circular vacuum groove located on the smooth surface within an inside diameter of the first proximately circular vacuum groove.

6. The processing chamber of claim 5 wherein the vacuum passage couples the second proximately circular vacuum groove to the vacuum port.

7. The processing chamber of claim 1 further comprising a lift pin support structure, the lift pin support structure coupling the lift pins to the actuator mechanism.

8. The processing chamber of claim 7 wherein the lift pin support structure comprises a lift pin support plate.

9. The processing chamber of claim 1 further comprising an actuator support, the actuator support coupling the first actuator mechanism to the wafer platen.

10. The processing chamber of claim 1 wherein the wafer platen comprises:
    a. an upper platen comprising the smooth surface, fourth through sixth lift pin holes, and the vacuum opening; and b. a lower platen coupled to the upper platen and comprising seventh through ninth lift pin holes, the lower platen coupling the first actuator mechanism to the upper platen, the first lift pin hole of the wafer platen comprising the fourth and seventh lift pin holes, the second lift pin hole of the wafer platen comprising the fifth and eighth lift pin holes, the third lift pin hole of the wafer platen comprising the sixth and ninth lift pin holes.

11. The processing chamber of claim 10 further comprising first through third nylon bushings coupled to the lower platen and located at least partially within the first through third lift pin holes of the lower platen, respectively.

12. The processing chamber of claim 11 wherein the upper platen further comprises a heating element groove on a back side of the upper platen opposite to the smooth surface.

13. The processing chamber of claim 10 further comprising first through third nylon bushings coupled to the upper platen and located at least partially within the first through third lift pin holes of the upper platen, respectively.

14. The processing chamber of claim 1 wherein the wafer platen comprises a fourth lift pin hole.

15. The processing chamber of claim 14 further comprising a fourth lift pin mounted within the fourth lift pin hole and coupled to the first actuator mechanism.

16. The processing chamber of claim 1 wherein the wafer platen comprises a plurality of additional lift pin holes.

17. The processing chamber of claim 16 further comprising a plurality of additional lift pins, the plurality of additional lift pins mounted within the plurality of additional lift pin holes, the plurality of additional lift pins coupled to the first actuator mechanism.

18. The processing chamber of claim 1 wherein the first actuator mechanism comprises an air cylinder.

19. The processing chamber of claim 1 wherein the first actuator mechanism comprises an electro-mechanical drive mechanism.

20. The processing chamber of claim 1 wherein the first actuator mechanism comprises a hydraulic cylinder.

21. The processing chamber of claim 1, wherein the lift pin holes and the vacuum openings are configured for high-pressure processing.

22. The processing chamber of claim 1, wherein a diameter of each lift pin hole is no larger than 0.100 inches.

23. The processing chamber of claim 1, wherein a width of each vacuum groove is no larger than 0.100 inches.

24. The processing chamber of claim 1, wherein the second actuator mechanism comprises a piston contained within a hydraulic cavity.

25. A processing chamber for processing a semiconductor wafer during high pressure processing comprising:
a. a wafer platen comprising a smooth surface, first through third lift pin holes, and a proximately circular vacuum groove for applying vacuum to a surface of the semiconductor wafer;
b. first through third lift pins mounted within the first through third lift pin holes, respectively;
c. an upper cavity plate configured to seal to the wafer platen, thereby forming a wafer cavity for entirely containing the semiconductor wafer during high-pressure processing;
d. a first actuator mechanism coupling the first through third lift pins to the wafer platen, the first actuator mechanism operable to extend the first through third lift pins above the smooth surface of the wafer platen, the first actuator mechanism operable to retract the first through third lift pins to at least flush with the smooth surface of the wafer platen; and
e. a second actuator mechanism coupled to the wafer platen, the second actuator mechanism operable to move the wafer platen against the upper cavity plate to seal the wafer platen to the upper cavity plate, thereby forming the wafer cavity.

26. A processing chamber for processing a semiconductor wafer during high pressure processing comprising:
a. an upper platen comprising a smooth surface, first through third lift pin holes, and a proximately circular vacuum groove for applying vacuum to a surface of a semiconductor wafer;
b. a lower platen coupled to the upper platen and comprising fourth through sixth lift pin holes, the fourth through sixth lift pin holes aligned with the first through third lift pin holes of the upper platen, respectively;
c. first through third lift pins, the first lift pin mounted within the first lift pin hole of the upper platen and the fourth lift pin hole of the lower platen, the second lift pin mounted within the second lift pin hole of the upper platen and the fifth lift pin hole of the lower platen, the third lift pin mounted within the third lift pin hole of the upper platen and the sixth lift pin hole of the lower platen;
d. a first actuator mechanism coupling the first through third lift pins to the lower platen, the first actuator mechanism operable to extend the first through third lift pins above the smooth surface of the upper platen, the first actuator mechanism operable to retract the first through third lift pins to at least flush with the smooth surface of the upper platen;
e. an upper cavity plate configured to seal to the upper platen, thereby forming a wafer cavity for entirely containing the semiconductor wafer during high-pressure processing; and
f. a second actuator mechanism coupled to the upper platen, the second actuator mechanism operable to move the upper platen against the upper cavity to seal the upper platen to the upper cavity plate, thereby forming the wafer cavity.

27. A processing chamber for processing a semiconductor wafer during high pressure processing comprising:
a wafer platen comprising a smooth and substantially continuous surface, first through third lift pin holes, and a vacuum opening located within the smooth surface, the vacuum opening operable to apply a vacuum to a surface of the semiconductor wafer;
b. first through third lift pins mounted within the first through third lift pin holes, respectively;
c. an upper cavity plate configured to seal to the wafer platen, thereby forming a wafer cavity for entirely containing the semiconductor wafer during high-pressure processing;
d. a first actuator mechanism coupling the first through third lift pins to the wafer platen, the first actuator mechanism operable to extend the first through third lift pins above the smooth surface of the wafer platen, the first actuator mechanism operable to retract the first through third lift pins to at least flush with the smooth surface of the wafer platen; and
e. a second actuator mechanism coupled to the wafer platen, the second actuator mechanism configured to move the wafer platen against the upper cavity plate to seal the wafer platen to the upper cavity plate thereby forming the wafer cavity.

28. A processing chamber for processing a semiconductor wafer during high pressure processing comprising:
   a. a wafer platen comprising a smooth surface, first through third lift pin holes, and a vacuum opening located within the smooth surface, the vacuum opening operable to apply a vacuum to a surface of a semiconductor wafer, wherein the semiconductor wafer is entirely within a high-pressure processing chamber during high-pressure processing;
   b. first through third lift pins mounted within the first through third lift pin holes, respectively;
   c. an upper cavity plate configured to seal to the wafer platen, thereby forming a wafer cavity for entirely containing the semiconductor wafer during high-pressure processing;
   d. a first actuator mechanism coupling the first through third lift pins to the wafer platen, the first actuator mechanism operable to extend the first through third lift pins above the smooth surface of the wafer platen, the first actuator mechanism operable to retract the first through third lift pins to at least flush with the smooth surface of the wafer platen; and
   e. a second actuator mechanism coupled to the wafer platen, the second actuator mechanism operable to move the wafer platen against the upper cavity plate to seal the wafer platen to the upper cavity plate, thereby forming the wafer cavity.

29. A processing chamber for processing a semiconductor wafer during high pressure processing comprising:
   a. a wafer platen comprising a smooth surface, first through third lift pin holes, and a vacuum opening located within the smooth surface, the vacuum opening operable to apply a vacuum to a surface of the semiconductor wafer;
   b. first through third lift pins mounted within the first through third lift pin holes, respectively;
   c. an upper cavity plate configured to seal to the wafer platen, thereby forming a wafer cavity for entirely containing the semiconductor wafer during high-pressure processing;
   d. means for moving pins coupling the first through third lift pins to the wafer platen, the means for moving pins operable to extend the first through third lift pins above the smooth surface of the wafer platen, the means for moving pins operable to retract the first through third lift pins to at least flush with the smooth surface of the wafer platen; and
   e. means for moving plates, the means for moving plates coupled to the wafer platen, the means for moving plates operable to move the wafer platen against the upper cavity plate to seal the wafer platen to the upper cavity plate, thereby forming the wafer cavity.

* * * * *

UNITED STATES PATENT AND TRADEMARK OFFICE
CERTIFICATE OF CORRECTION

PATENT NO. : 6,722,642 B1  Page 1 of 4
DATED : April 20, 2004
INVENTOR(S) : Sutton et al.

It is certified that error appears in the above-identified patent and that said Letters Patent is hereby corrected as shown below:

Title page,
Item [56], References Cited, add the following references cited:

| | | | | | |
|---|---|---|---|---|---|
| --2,617,719 | 11/11/52 | C. R. Stewart | 23 | 312 | |
| 2,625,886 | 01/20/53 | Browne | 103 | 150 | |
| 3,744,660 | 07/10/73 | Gaines et al. | 220 | 10 | |
| 3,968,885 | 07/13/76 | Hassan et al. | 214 | 1 BC | |
| 4,029,517 | 06/14/77 | Rand | 134 | 11 | |
| 4,091,643 | 05/30/78 | Zucchini | 68 | 18C | |
| 4,245,154 | 01/13/81 | Uehara et al. | 250 | 227 | |
| 4,341,592 | 07/27/82 | Shortes et al. | 156 | 643 | |
| 4,355,937 | 10/26/82 | Mack et al. | 414 | 217 | |
| 4,367,140 | 01/04/83 | Wilson | 210 | 110 | |
| 4,406,596 | 09/27/83 | Budde | 417 | 393 | |
| 4,422,651 | 12/27/83 | Platts | 277 | 206 R | |
| 4,474,199 | 10/02/84 | Blaudszun | 134 | 105 | |
| 4,522,788 | 06/11/85 | Sitek et al. | 422 | 78 | |
| 4,549,467 | 10/29/85 | Wilden et al. | 91 | 307 | |
| 4,592,306 | 06/03/86 | Gallego | 118 | 719 | |
| 4,601,181 | 07/22/86 | Privat | 68 | 18C | |
| 4,626,509 | 12/02/86 | Lyman | 435 | 287 | |
| 4,670,126 | 06/02/87 | Messer et al. | 204 | 298 | |
| 4,682,937 | 07/28/87 | Credle, Jr. | 417 | 393 | |
| 4,693,777 | 09/15/87 | Hazano et al. | 156 | 345 | |
| 4,778,356 | 10/18/88 | Hicks | 417 | 397 | |
| 4,788,043 | 11/29/88 | Kagiyama et al. | | 422 | 292 |
| 4,789,077 | 12/06/88 | Noe | 220 | 319 | |
| 4,823,976 | 04/25/89 | White, III et al | 220 | 211 | |
| 4,825,808 | 05/02/89 | Takahashi et al. | | 118 | 719 |
| 4,827,867 | 05/09/89 | Takei et al. | 118 | 64 | |
| 4,838,476 | 06/13/89 | Rahn | 228 | 180.1 | |
| 4,865,061 | 09/12/89 | Fowler et al. | 134 | 108 | |
| 4,879,431 | 11/07/89 | Bertoncini | 435 | 311 | |
| 4,917,556 | 04/17/90 | Stark et al. | 414 | 217 | |
| 4,924,892 | 05/15/90 | Kiba et al. | 134 | 123 | |

UNITED STATES PATENT AND TRADEMARK OFFICE
CERTIFICATE OF CORRECTION

PATENT NO. : 6,722,642 B1
DATED : April 20, 2004
INVENTOR(S) : Sutton et al.

Page 2 of 4

It is certified that error appears in the above-identified patent and that said Letters Patent is hereby corrected as shown below:

Title page (cont'd),

| | | | | |
|---|---|---|---|---|
| 4,960,140 | 10/02/90 | Ishijima et al. | 134 | 31 |
| 4,983,223 | 01/08/91 | Gessner | 134 | 25.4 |
| 5,011,542 | 04/30/91 | Weil | 134 | 38 |
| 5,044,871 | 09/03/91 | Davis et al. | 414 | 786 |
| 5,062,770 | 11/05/91 | Story et al. | 417 | 46 |
| 5,071,485 | 12/10/91 | Matthews et al. | 134 | 2 |
| 5,105,556 | 04/21/92 | Kurokawa et al. | 34 | 12 |
| 5,167,716 | 12/01/92 | Boitnott et al. | 118 | 719 |
| 5,169,296 | 12/08/92 | Wilden | 417 | 395 |
| 5,169,408 | 12/08/92 | Biggerstaff et al. | 29 | 25.01 |
| 5,185,296 | 02/09/93 | Morita et al. | 437 | 229 |
| 5,186,718 | 02/16/93 | Tepman et al. | 29 | 25.01 |
| 5,188,515 | 02/23/93 | Horn | 417 | 63 |
| 5,190,373 | 03/02/93 | Dickson et al. | 366 | 146 |
| 5,191,993 | 03/09/93 | Wanger et al. | 220 | 333 |
| 5,672,204 | 09/30/97 | Habuka | 117 | 204 |
| 5,817,178 | 10/06/98 | Mita et al. | 118 | 666 |
| 6,508,259 B1 | 01/21/03 | Tseronis et al. | 134 | 105 |
| 6,561,767 B2 | 05/13/03 | Berger et al. | 417 | 53 |
| JP 61-017151 | 01/25/86 | Japan | G03G | 5/082 |
| CN 1399790 A | 02/26/03 | China | H01L | 21/00 |
| DE 36 08 783 A1 | 09/17/87 | Germany | C30B | 25/12 |
| DE 198 60 084 A1 | 07/06/00 | Germany | H01L | 21/3213 |
| EP 0 244 951 A2 | 11/11/87 | EPO | H01L | 21/00 |
| EP 0 272 141 A2 | 06/22/88 | EPO | H01L | 21/00 |
| EP 0 453 867 A1 | 10/30/91 | EPO | F16K | 51/02 |
| EP 0 572 913 A1 | 12/08/93 | EPO | B01D | 11/02 |
| EP 0 587 168 A1 | 03/16/94 | EPO | B08B | 7/00 |
| EP 0 679 753 B1 | 11/02/95 | EPO | D06F | 43/00 |
| EP 0 903 775 A2 | 03/24/99 | EPO | H01L | 21/00 |
| FR 1.499.491 | 09/18/67 | France | F16K | |
| GB 2 003 975 | 03/21/79 | Great Britain | F04B | 43/06 |
| GB 2 193 482 | 02/10/88 | Great Britain | B25J | 18/02 |
| JP 2-148841 | 06/07/90 | Japan | H01L | 21/306 |
| JP 2-209729 | 8/21/90 | Japan | H01L | 21/302 |
| JP 8-186140 | 07/16/96 | Japan | H01L | 21/56 |
| JP 10-144757 | 05/29/98 | Japan | H01L | 21/68 |
| JP 10-335408 | 12/18/98 | Japan | H01L | 21/31 |
| JP 11-200035 | 07/27/99 | Japan | C23C | 14/34 |
| JP 56-142629 | 11/07/81 | Japan | H01L | 21/205 |
| JP 60-238479 | 11/27/85 | Japan | C23C | 14/56 |
| JP 60-246635 | 12/06/85 | Japan | H01L | 21/302 |
| JP 61-231166 | 10/15/86 | Japan | C23C | 14/24 |
| JP 62-125619 | 06/06/87 | Japan | H01L | 21/30 |
| JP 63-303059 | 12/09/88 | Japan | C23C | 14/22 |
| 2000/106358 | 04/11/00 | Japan | H01L | 21/3065 |
| SE 251213 | 08/16/48 | Swiss | 100a | |
| WO 91/12629 | 08/22/91 | PCT | H01L | 21/00 |
| WO 99/18603 | 04/15/99 | PCT | H 01L | 21/00 |
| WO 00/36635 | 06/22/00 | PCT | H01L | 21/00 |
| WO 01/10733 A1 | 2/15/01 | PCT | B65D | 55/00 |
| WO 01/33615 A3 | 5/10/01 | PCT | H01L | 21/00 |
| WO 01/55628 A1 | 08/02/01 | PCT | F16K | 51/02 |

UNITED STATES PATENT AND TRADEMARK OFFICE
CERTIFICATE OF CORRECTION

PATENT NO.   : 6,722,642 B1
DATED        : April 20, 2004
INVENTOR(S)  : Sutton et al.

It is certified that error appears in the above-identified patent and that said Letters Patent is hereby corrected as shown below:

Title page (cont'd),

| | | | | |
|---|---|---|---|---|
| WO 01/68279 A2 | 09/20/01 | PCT | B08B | 7/00 |
| WO 01/74538 A1 | 10/11/01 | PCT | B24C | 1/00 |
| WO 01/78911 A1 | 10/25/01 | PCT | B08B | 3/00 |
| WO 01/85391 A2 | 11/15/01 | PCT | B24B | |
| WO 01/94782 A3 | 12/13/01 | PCT | F04B | 43/02 |
| WO 02/16051 A2 | 02/28/02 | PCT | B05D | |
| WO 03/030219 A2 | 10/04/03 | PCT | H01L | |

Hideaki Itakura et al., "Multi-Chamber Dry Etching System", Solid State Technology, April 1982, pp. 209-214.
Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.
Dahmen, N. et al., "Supercritical Fluid Extraction of Grinding and Metal Cutting Waste Contaminated with Oils," Supercritical Fluids - Extraction and Pollution Prevention, ACS Symposium Series, Vol. 670, pp. 270-279, 21 Oct 1997.
Xu, C. et al., "Submicron-Sized Spherical Yttrium Oxide Based Phosphors Prepared by Supercritical $CO_2$-Assisted aerosolization and pyrolysis," Appl. Phys. Lett., Vol. 71, No.12, September 22, 1997, pp. 1643-1645.
Courtecuisse, V.G. et al., "Kinetics of the Titanium Isopropoxide Decomposition in Supercritical Isopropyl Alcohol, " Ind. Eng. Chem. Res., Vol. 35, No. 8, pp. 2539-2545, Aug 1996.
Gallagher-Wetmore, P. et al., "Supercritical Fluid Processing: A New Dry Technique for Photoresist Developing," SPIE Vol. 2438, pp.694-708, Jun. 1995.
McHardy, J. et al., "Progress in Supercritical $CO_2$ Cleaning," SAMPE Jour., Vol. 29, No. 5, pp. 20-27, September 1993.
Purtell, R, et al., "Precision Parts Cleaning using Supercritical Fluids, " J. Vac, Sci, Technol. A. Vol. 11, No. 4, July 1993, pp. 1696-1701.
Hybertson, B.M. et al., "Deposition of Palladium Films by a Novel Supercritical Fluid Transport Chemical Deposition Process," Mat. Res. Bull., Vol. 26, pp. 1127-1133, 1991.
Ziger, D. H. et al., "Compressed Fluid Technology: Application to RIE-Developed Resists," AiChE Jour., Vol. 33, No. 10, pp. 1585- 1591, October 1987.
Matson, D.W. et al., "Rapid Expansion of Supercritical Fluid Solutions: Solute Formation of Powders, Thin Films, and Fibers," Ind. Eng. Chem. Res., Vol. 26, No. 11, pp. 2298-2306, 1987.
Tolley, W.K. et al., "Stripping Organics from Metal and Mineral Surfaces using Supercritical Fluids," Separation Science and Technology, Vol. 22, pp. 1087-1101, 1987.
Joseph L. Foszcz, "Diaphragm Pumps Eliminate Seal Problems", Plant Engineering , pp. 1-5, February 1, 1996.
Bob Agnew, "WILDEN Air-Operated Diaphram Pumps", Process & Industrial Training Technologies, Inc., 1996.
Hansen, B. N. et al., " Supercritical Fluid Transport - Chemical Deposition of Films," Chem. Mater., Vol. 4, No. 4, pp. 749-752, 1992.--.

UNITED STATES PATENT AND TRADEMARK OFFICE
CERTIFICATE OF CORRECTION

PATENT NO. : 6,722,642 B1
DATED : April 20, 2004
INVENTOR(S) : Sutton et al.

It is certified that error appears in the above-identified patent and that said Letters Patent is hereby corrected as shown below:

Drawings,
Add labels 12A and 88 to Figure 5.

Column 7,
Lines 44 and 46, replace "The processing chamber of claim 1" with -- The processing chamber of claim 21 --.

Signed and Sealed this

Twenty-ninth Day of June, 2004

JON W. DUDAS
*Acting Director of the United States Patent and Trademark Office*